(12) United States Patent
Matsuura (10) Patent No.: US 6,673,484 B2
(45) Date of Patent: Jan. 6, 2004

(54) IC DEVICE, CIRCUIT BOARD AND IC ASSEMBLY

(75) Inventor: Kouji Matsuura, Saitama (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 336 days.

(21) Appl. No.: 09/901,054

(22) Filed: Jul. 10, 2001

(65) Prior Publication Data

US 2002/0004163 A1 Jan. 10, 2002

(30) Foreign Application Priority Data

Jul. 10, 2000 (JP) ........................................ 2000-207745

(51) Int. Cl.[7] ............................................... H01M 2/10
(52) U.S. Cl. ......................... 429/96; 429/100; 257/499
(58) Field of Search ..................... 429/96, 100; 257/499

(56) References Cited

U.S. PATENT DOCUMENTS

| | | | | |
|---|---|---|---|---|
| 5,403,782 A | * | 4/1995 | Dixon et al. | 29/827 |
| 5,451,715 A | * | 9/1995 | Hundt et al. | 174/52.4 |
| 5,498,903 A | * | 3/1996 | Dixon et al. | 257/690 |
| 5,570,273 A | * | 10/1996 | Siegel et al. | 361/773 |
| 6,109,530 A | * | 8/2000 | Larson et al. | 235/492 |
| 6,208,114 B1 | * | 3/2001 | Jones et al. | 320/107 |
| 6,351,099 B2 | * | 2/2002 | Jones et al. | 320/132 |

\* cited by examiner

*Primary Examiner*—Bruce F. Bell
(74) *Attorney, Agent, or Firm*—Sughrue Mion, PLLC (57) ABSTRACT

An IC assembly includes: a circuit board; an IC device mounted on the circuit board, said IC device including an IC placed on the circuit board and a plurality of connecting terminals for fixing the IC onto the circuit board; and a battery cell mounted on the circuit board in such a manner that one of the IC device and the battery cell overlaps the other in a direction substantially perpendicular to the circuit board, wherein a plurality of electrode-connecting terminals are provided to electrically connect the battery cell to the circuit board.

20 Claims, 6 Drawing Sheets

IC DEVICE, CIRCUIT BOARD AND IC ASSEMBLY

This patent application claims a priority on a Japanese patent application, 2000-207745 filed on Jul. 10, 2000, the contents of which are incorporated herein by reference.

BACKGROUND OF THE INVENTION

1. Field of the Invention

The present invention relates to an IC device, a circuit board and an IC assembly. More particularly, the present invention relates to an IC device, a circuit board and an IC assembly that allow a battery cell to be mounted on the circuit board in such a manner that the battery cell and the IC device are arranged in a direction perpendicular to the circuit board.

2. Description of the Related Art

In recent years, portable devices, such as camera and a mobile phone, have been developed significantly, so as to have multiple functions. In order to realize the multiple functions, it is necessary to mount a plurality of electric devices and circuits onto a circuit board.

The electric devices to be mounted on the circuit board include an integrated circuit (IC) and a battery cell, for example. These electric devices, however, occupy a relatively large area of the circuit board, thus preventing the size reduction of the portable devices.

SUMMARY OF THE INVENTION

In order to realize the small portable devices having multiple functions, it is necessary to efficiently use a limited space on the circuit board. Therefore, it is an object of the present invention to provide an IC device, a circuit board and an IC assembly, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, an IC device for use with a battery cell, comprises: an IC operable to be mounted on a circuit board; a plurality of connecting terminals, extending from the IC, operable to fix the IC to the circuit board; and a plurality of electrode-connecting terminals operable to connect the battery cell to the circuit board when the battery cell is mounted on the circuit board in such a manner that one of the battery cell and the IC overlaps the other in a direction substantially perpendicular to the circuit board.

Parts of the plurality of connecting terminals may serve as the electrode-connecting terminals.

The IC device may include a controller operable to control power supply from the battery cell.

According to the second aspect of the present invention, a circuit board for use with an IC device and a battery cell, comprises: a first surface onto which the IC device is to be mounted; a second surface opposite to the first surface; and a plurality of electrode-connecting terminals operable to connect the battery cell to the circuit board when the battery cell is mounted on the circuit board in such a manner that one of the IC device and the battery cell overlaps the other in a direction substantially perpendicular to the circuit board.

The battery cell may be mounted on the first surface to be positioned on the IC device.

Alternatively, the battery cell may be mounted on the second surface, and the electrode-connecting terminals are provided on the second surface.

In this case, the circuit board may further comprise a battery accommodating portion operable to accommodate at least a part of the battery cell, that is formed in the second surface. The battery accommodating portion may be a dent formed in the second surface.

According to the third aspect of the present invention, an IC assembly comprises: a circuit board; an IC device mounted on the circuit board, the IC device including an IC placed on the circuit board and a plurality of connecting terminals operable to fix the IC onto the circuit board; and a battery cell mounted on the circuit board in such a manner that one of the IC device and the battery cell overlaps the other in a direction substantially perpendicular to the circuit board, wherein a plurality of electrode-connecting terminals are provided to connect the battery cell to the circuit board.

The battery cell may be placed on the IC of the IC device. In this case, parts of the plurality of connecting terminals of the IC device may serve as the electrode-connecting terminals. Alternatively, the electrode-connecting terminals maybe provided separately from the connecting terminals.

The circuit board may include a first surface on which the IC device is mounted and a second surface opposite to the first surface, while the battery cell maybe mounted on the second surface and the electrode-connecting terminals are provided on the second surface.

The battery cell may be mounted on the second surface to be overlapped by the IC device.

The second surface of the circuit board may have a battery accommodating portion operable to accommodate at least a part of the battery cell therein. The battery accommodating portion may be an opening passing from the second surface to the first surface. Alternatively, the battery accommodating portion may be a dent formed in the second surface.

The battery cell may be a battery cell for backup of a device into which the IC assembly is incorporated. In this case, the IC device may have at least a function of controlling power supply from the battery cell to the device. Moreover, the battery cell may be chargeable, while the IC device may have at least a function of controlling charging of the battery cell.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

(Embodiment 1)

Figure 1A:
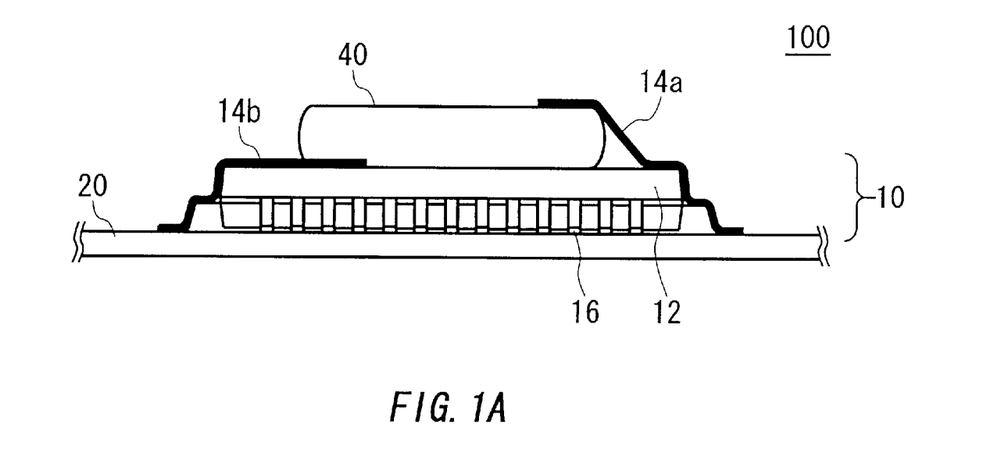
FIGS. 1A and 1B are side and top views of an IC assembly according to the first embodiment of the present invention, respectively.
Figure 1B:
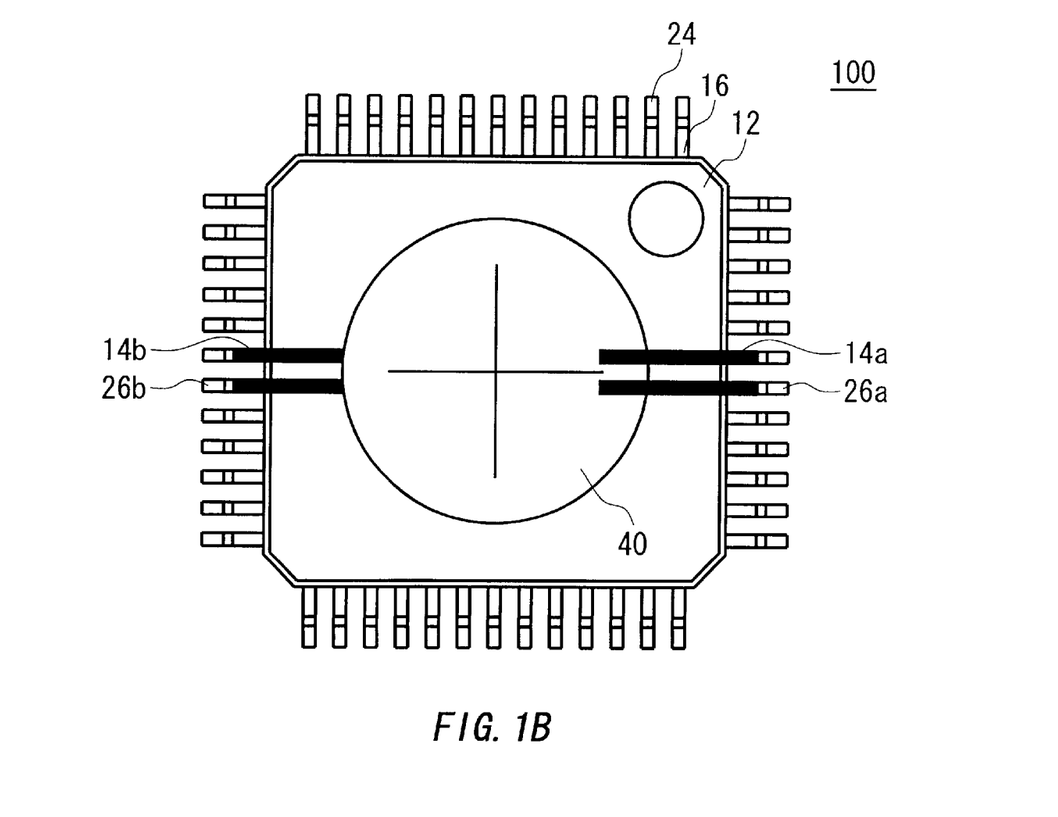

FIGS. 1A and 1B schematically show an IC assembly 100 according to the first embodiment of the present invention. FIG. 1A shows a side face of the IC assembly 100. The IC assembly 100 includes an IC device 10 and a circuit board 20 having a first surface on which the IC device 10 is mounted and a second surface opposite to the first surface. The IC device 10 includes an IC 12 and a plurality of connecting terminals 16 extending from the IC 12. The IC 12 includes at least one semiconductor integrated circuit accommodated in a resin package. The connecting terminals 16 fix the IC 12 onto the circuit board 20, and electrically connect the integrated circuit (s) in the IC 12 to a circuit provided on the circuit board 20.

A battery cell 40 is mounted on the circuit board 20 in such a manner that one of the IC device 10 and the battery cell 40 overlaps the other in a direction substantially perpendicular to the circuit board 20. In the present embodiment, a battery-cell place where a battery cell 40 is to be placed is provided on an upper face of the IC 12, and therefore the button-like battery cell 40 is placed on the upper face of the IC 12. A plurality of electrode-connecting terminals 14a and 14b are provided to extend on the upper face of the IC device 10, as shown in FIG. 1A, to electrically connect electrodes of the battery call 40 to the circuit board 20. The electrode-connecting terminal 14a is in contact with a positive electrode provided on the upper face of the battery cell 40, thereby connecting the positive electrode of the battery cell 40 to the circuit board 20. The electrode-connecting terminal 14b is in contact with a negative electrode provided on the lower face of the battery cell 40, thereby connecting the negative electrode of the battery cell 40 to the circuit board 20. The electrode-connecting terminals 14a and 14b may be soldered to the battery cell 40, for example. Moreover, the electrode-connecting terminals 14a and 14b maybe brought into contact with the electrodes of the battery cell 40 by pressing the upper face of the battery cell 40 via sheath or the like.

FIG. 1B is a top view of the IC assembly 100. On the circuit board 20 are provided IC-connecting portions 24 at which the IC 12 is to be connected to the circuit board 20 via the connecting terminals 16 and electrode-connecting portions 26a and 26b at which the battery cell 40 is to be connected to the circuit board 20 via the electrode-connecting terminals 14a and 14b. In the present embodiment, parts of the connecting terminals 16 serve as the electrode-connecting terminals 14a and 14b. Each of the electrode-connecting terminals 14a and 14b is connected to one connecting terminal 16. For each of the positive and negative electrodes, two electrode-connecting terminals are provided in the example shown in FIG. 1B. The connecting terminal 16 to which each of the electrode-connecting terminal 14a or 14b is connected to the corresponding IC-connecting portion 24 on the circuit board 20, that serves as the electrode-connecting portion 26. Thus, the electrodes of the battery cell 40 are connected to the electrode-connecting portion 26a and 26b on the circuit board 20.

According to the arrangement shown in FIGS. 1A and 1B, the battery cell 40 can be placed on the upper face of the IC device 10. Thus, as compared to a case where the battery cell 40 and the IC device 10 are arranged on the circuit board 20 separately from each other, the space on the circuit board 20 can be used efficiently, thereby enabling the size reduction of the portable device including the battery cell 40 and the IC device 10, such as a camera. Moreover, since the sheath of the battery cell 40 is generally formed of metal, it is possible to efficiently radiate heat generated within the IC 12 because of operations of the portable device. Furthermore, since at least one of the connecting terminals 16 is used as each of the electrode-connecting terminals 14a and 14b, it is possible to connect the battery cell 40 to the circuit board 20 by a simple arrangement.

(Embodiment 2)

Figure 2A:
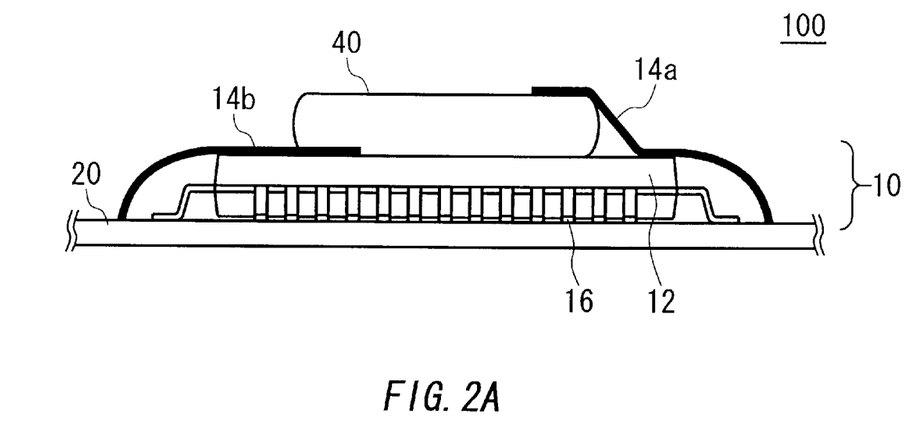
FIGS. 2A and 2B are side and top views of an IC assembly according to the second embodiment of the present invention, respectively.
Figure 2B:
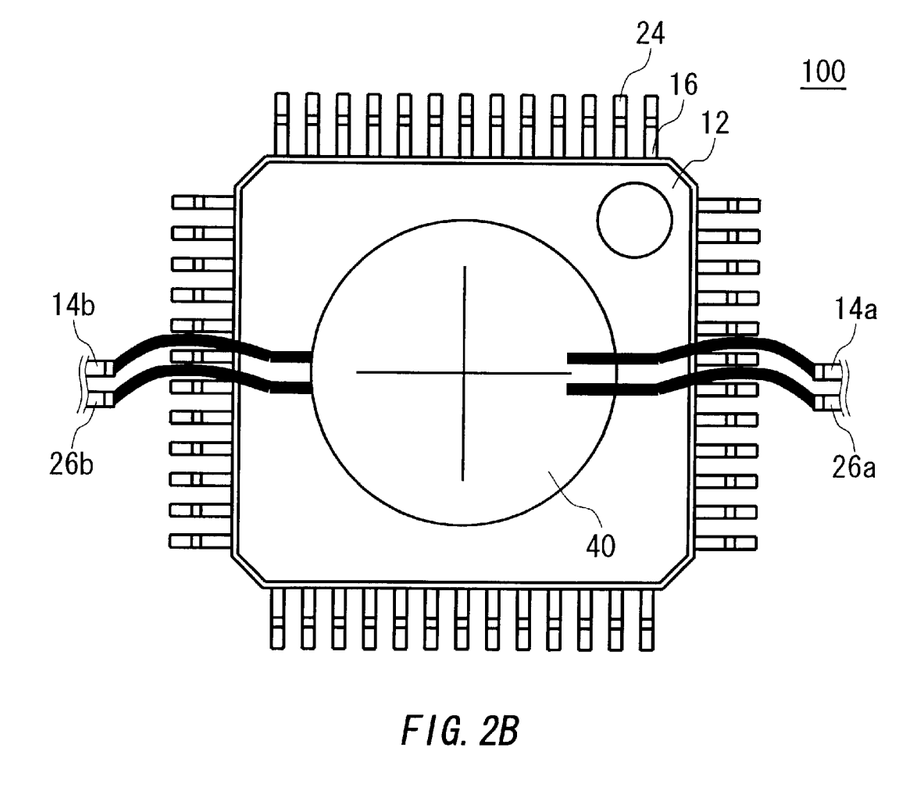

FIGS. 2A and 2B schematically show an IC assembly 100 according to the second embodiment of the present invention. FIG. 2A shows a side face of the IC assembly 100. The IC assembly 100 includes an IC device 10 and a circuit board 20 having a first surface on which the IC device 10 is mounted and a second surface opposite to the first surface. The IC device 10 includes an IC 12 and a plurality of connecting terminals 16 extending from the IC 12. The IC 12 is at least one semiconductor integrated circuit accommodated in a resin package. The connecting terminals 16 fix the IC 12 to the circuit board 20 and also electrically connect the integrated circuit(s) in the IC 12 to a circuit provided on the circuit board 20. The circuit board 20 includes electrode-connecting terminals 14a and 14b.

A battery cell 40 is mounted on the circuit board 20 in such a manner that one of the IC device 10 and the battery cell 40 overlaps the other in a direction substantially perpendicular to the circuit board 20. In the present embodiment, a battery-cell place where a battery cell 40 is to be placed is provided on an upper face of the IC 12, and therefore the button-like battery cell 40 is placed on the IC 12. The electrode-connecting terminals 14a and 14b electrically connect electrodes of the battery cell 40 to the circuit board 20. The electrode-connecting terminal 14a is in contact with a positive one of the electrodes of the battery cell 40 that is provided on an upper face of the battery cell 40, so as to connect the positive electrode of the battery cell 40 to the circuit board 20. The electrode-connecting terminal 14b is in contact with a negative one of the electrodes of the battery cell 40 that is provided on a lower face of the battery cell 40, so as to connect the negative electrode of the battery cell 40 to the circuit board 20.

FIG. 2B is a top view of the IC assembly 100. The IC device 10 is connected to IC-connecting portions 24 provided on the circuit board 20 by the connecting terminals 16, as in the first embodiment. However, electrode-connecting portions 26a and 26b are provided separately from the IC-connecting portions 24, as shown in FIG. 1B, although parts of the IC-connecting portions 24 serve as the electrode-connecting portions 26a and 26b in the first embodiment.

The electrode-connecting terminals 14a that are brought into contact with the positive electrode of the battery cell 40 are connected to the electrode-connecting portions 26a without being connected to the connecting terminals 16. Similarly, the electrode-connecting terminals 14b that are brought into contact with the negative electrode of the battery cell 40 are connected to the electrode-connecting portions 26b without being connected to the connecting terminals 16b.

According to the arrangement shown in FIGS. 2A and 2B, it is possible to efficiently use the space on the circuit board 20, thereby enabling the size reduction of the portable device.

In the IC assembly 100 of the first embodiment, each electrode-connecting terminal 14a or 14b is formed to include a part of the connection electrode 16. However, according to the present embodiment, each electrode-connecting terminal 14a or 14b is provided as a separate component from the connection terminal 16. Thus, even if all the connecting terminals 16 are used for fixing the IC 12 onto the circuit board 20, the battery cell 40 can be connected to the circuit board 20.

(Embodiment 3)

Figure 3A:
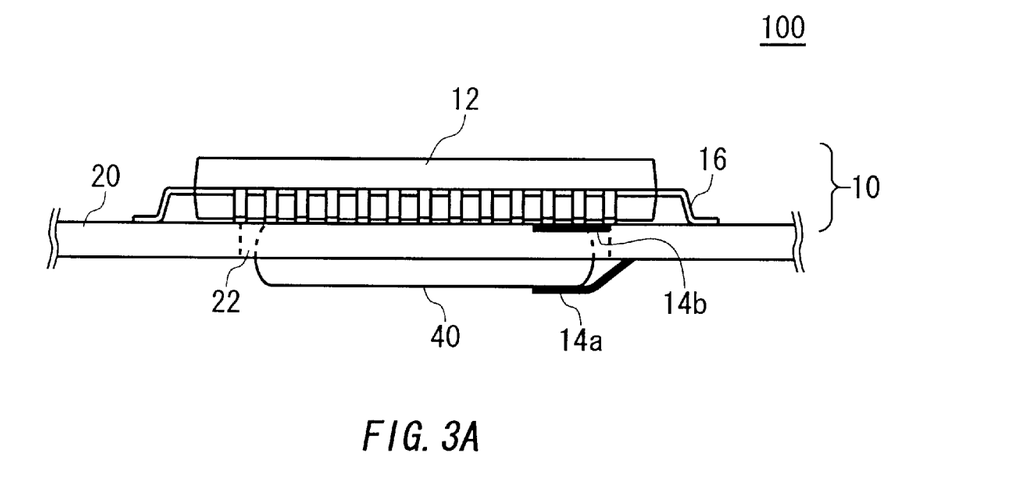
FIGS. 3A and 3B are side and top views of an IC assembly according to the third embodiment of the present invention, respectively.
Figure 3B:
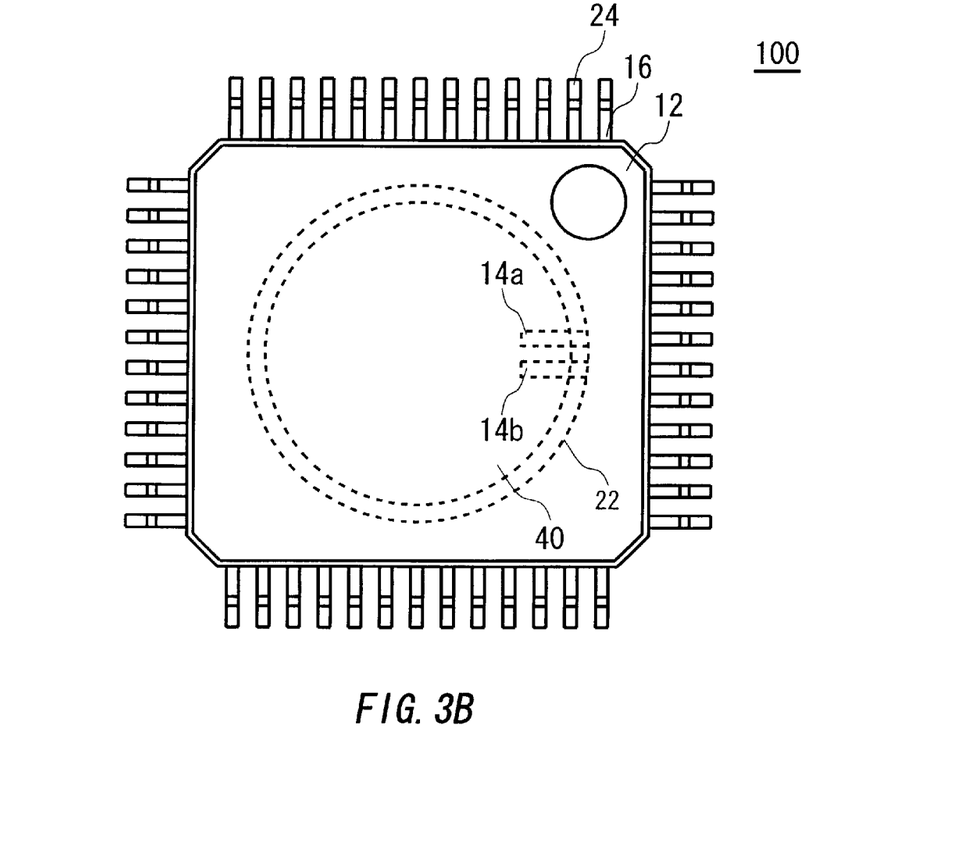

FIGS. 3A and 3B schematically show an IC assembly 100 according to the third embodiment of the present invention. FIG. 3A shows a side face of the IC assembly 100. The IC assembly 100 includes an IC device 10 and a circuit board 20 having a first surface on which the IC device 10 is mounted and a second surface opposite to the first surface. The IC device 10 includes an IC 12 and a plurality of connecting terminals 16 extending from the IC 12. The IC 12 includes at least one semiconductor integrated circuit accommodated in a resin package. The connecting terminals 16 fix the IC 12 to the circuit board 20 and also electrically connect the integrated circuit(s) in the IC 12 to a circuit on the circuit board 20. The circuit board 20 includes a battery accommodating portion 22 that can accommodate at least a part of a battery cell 40 and electrode-connecting terminals 14a and 14b that can electrically connect the battery cell 40 to the circuit board 20.

A battery-cell place is provided in the circuit board 20 to be overlapped by the IC device 10 when the IC device 10 is mounted on the circuit board 20. The battery accommodating portion 22 is formed by a dent provided in the battery-cell place. In the present embodiment, the dent is provided as an opening passing through the circuit board 20. The button-like battery cell 40 is placed in the opening in such a manner at least part of the battery cell 40 is accommodated in the battery accommodating portion 22. Therefore, the battery cell 40 and the IC device 10 are arranged in a direction substantially perpendicular to the circuit board 20.

The electrode-connecting terminals 14a and 14b electrically connect electrodes of the battery cell 40 to the circuit board 20. More specifically, the electrode-connecting terminal 14a is brought into contact the positive electrode of the battery cell 40 provided on one surface of the battery cell 40, so as to connect the positive electrode of the battery cell 40 to the circuit board 20. The electrode-connecting terminal 14b is brought into contact with the negative electrode of the battery cell 40 provided on the other surface of the battery cell 40 that is opposite to the surface on which the positive electrode thereof is provided, so as to connect the negative electrode of the battery cell 40 to the circuit board 20.

FIG. 3B is a top view of the IC assembly 100. The IC device 10 is connected to IC-connecting portions 24 provided on the first surface of the circuit board 20 via the connecting terminals 16. The electrode-connecting terminals 14a and 14b that are brought into contact with the positive and negative electrodes of the battery cell 40, respectively, are connected to predetermined portions on the second surface of the circuit board 20.

According to the arrangement shown in FIGS. 3A and 3B, the IC device 10 and the battery cell 40 are mounted on the circuit board 20 in such a manner that the IC device 10 overlaps the battery cell 40 in the direction substantially perpendicular to the circuit board 20. Thus, it is possible to efficiently use the circuit board 20 as in the first and second embodiments, so as to reduce the size of the portable device. Moreover, since at least part of the battery cell 40 is accommodated in the battery accommodating portion 22, the volume of the entire device can be reduced by a volume of the part of the battery cell 40 accommodated in the battery accommodating portion 22 as compared to a case where the battery cell 40 and the IC device 10 are arranged separately from each other on the circuit board 20. In addition, since the dent serving as the battery accommodating portion 22 is formed as the opening through the circuit board 20, it is possible to easily form the battery accommodating portion 22.

In the present embodiment, the battery-cell place is arranged directly below the IC device 10 to be overlapped by the IC device 10 completely. However, the battery-cell place may be arranged so as to be partially overlapped by the IC device 10. In other words, the battery cell 40 may go beyond the outer line of the IC device 10, when seen from the above.

(Embodiment 4)

Figure 4A:
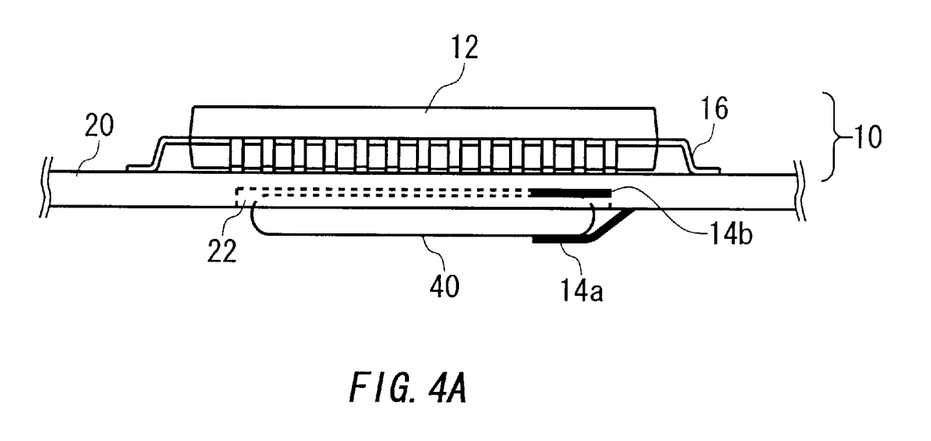
FIGS. 4A and 4B are side and top views of an IC assembly according to the fourth embodiment of the present invention, respectively.
Figure 4B:
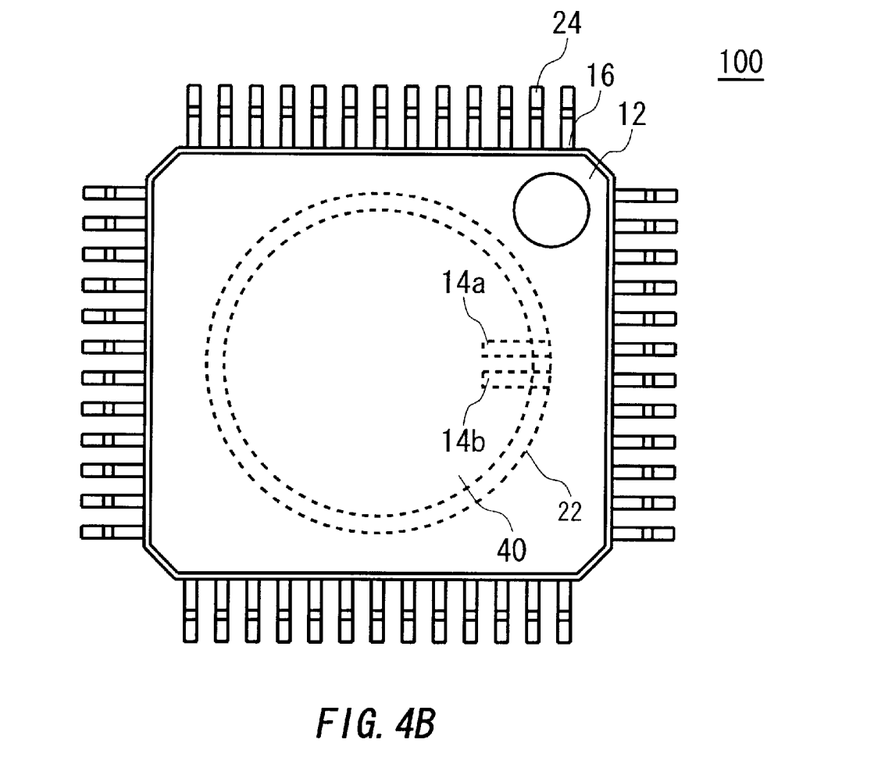

FIGS. 4A and 4B schematically show an IC assembly 100 according to the fourth embodiment of the present invention. FIG. 4A is a side view of the IC assembly 100. The IC assembly 100 includes an IC device 10 and a circuit board 20 having a first surface on which the IC device 10 is mounted and a second surface opposite to the first surface. The IC device 10 includes an IC 12 and a plurality of connecting terminals 16 extending from the IC 12. The IC 12 includes at least one semiconductor integrated circuit accommodated in a resin package. The connecting terminals 16 fix the IC 12 to the circuit board 20, and also electrically connect the integrated circuit(s) in the IC 12 to a circuit provided on the circuit board 20. The circuit board 20 includes a battery accommodating portion 22 for accommodating at least part of a battery cell 40 and a plurality of electrode-connecting terminals 14a and 14b for electrically connecting the battery cell 40 to the circuit board 20.

A battery-cell place is provided in the second surface of the circuit board 20 in such a manner that the IC 12 overlaps the battery-cell place when the IC 12 is mounted onto the circuit board 20. The battery accommodating portion 22 is formed by a dent provided in the battery-cell place. Although the dent is formed as the opening through the circuit board 20 in the third embodiment, the dent is formed not to completely pass through the circuit board 20 in the present embodiment. Thus, the strength of the circuit board 20 can be improved.

The button-like battery cell 40 is arranged in such a manner that at least part of the battery cell 40 is accommodated within the battery accommodating portion 22. The electrode-connecting terminals 14a and 14b electrically connect electrodes of the battery cell 40 to the circuit board 20. More specifically, the electrode-connecting terminal 14a is brought into contact with the positive electrode of the battery cell 40 provided on one surface of the battery cell 40, thereby connecting the positive electrode of the battery cell 40 to a predetermined portion on the second surface of the circuit board 20. The electrode-connecting terminal 14b is brought into contact with the negative electrode of the battery cell 40 provided on the other surface of the battery cell 40, that is opposite to the surface on which the positive electrode thereof is provided, thereby connecting the negative electrode of the battery cell 40 to another predetermined portion on the second surface of the circuit board 20.

FIG. 4B is a top view of the IC assembly 100. The IC device 10 is connected to IC-connecting portions 24 on the first surface of the circuit board 20 via the connecting terminals 16. The electrode-connecting terminals 14a and 14b that are in contact with the positive and negative electrodes of the battery cell 40, respectively, are connected to the predetermined portions on the second surface of the circuit board 20.

According to the arrangement shown in FIGS. 4A and 4B, the IC device 10 and the battery cell 40 are mounted on the circuit board 20 in such a manner that one of the IC device 10 and the battery cell 40 overlaps the other in the direction substantially perpendicular to the circuit board 20. Thus, it is possible to efficiently use the circuit board 20 as in the first through third embodiments, thereby enabling the size reduction of the portable devices including the IC device 10 and the battery cell 40. Moreover, as in the third embodiment, the total volume of the IC assembly 100 can be reduced since the battery accommodating portion 22 accommodates at least part of the battery cell 40. In addition, since the dent serving as the battery accommodating portion 22 is formed so as not to pass through the circuit board 20, that is, the dent is formed with a part of the circuit board 20 remaining between the dent and the IC device 10, the strength of the circuit board 20 can be improved as compared to that in the third embodiment.

(Embodiment 5)

Figure 5A:
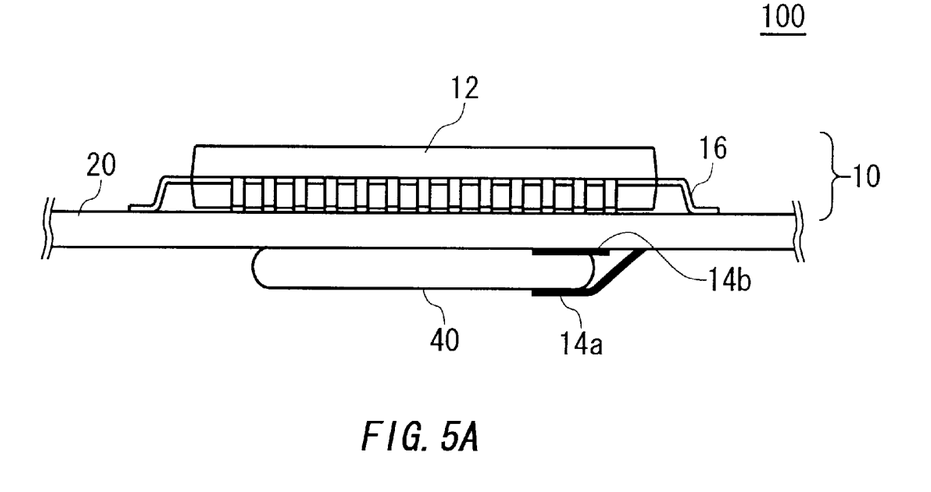
FIGS. 5A and 5B are side and top views of an IC assembly according to the fifth embodiment of the present invention, respectively.
Figure 5B:
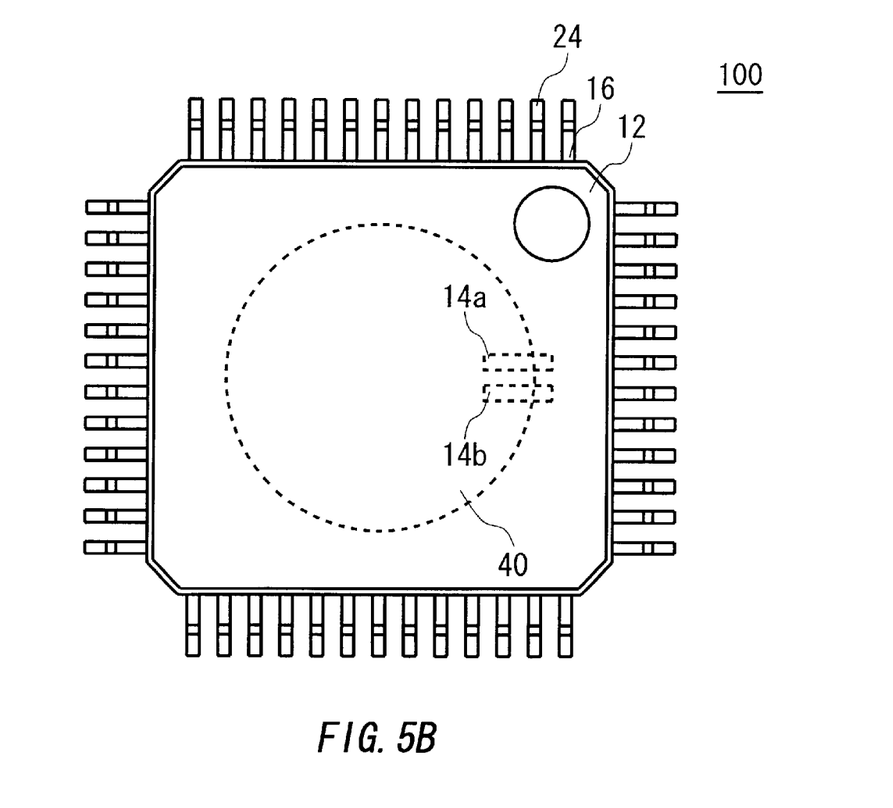

FIGS. 5A and 5B schematically show an IC assembly 100 according to the fifth embodiment of the present invention. FIG. 5A is a side view of the IC assembly 100. The IC assembly 100 includes an IC device 10 and a circuit board 20 having a first surface on which the IC device 10 is mounted and a second surface opposite to the first surface. The IC device 10 includes an IC 12 and a plurality of connecting terminals 16 extending from the IC 12. The IC 12 includes at least one semiconductor integrated circuit accommodated in a resin package. The connecting terminals 1G fix the IC 12 to the circuit board 20, and also electrically connect the integrated circuit(s) in the IC 12 to a circuit provided on the circuit board 20. The circuit board 20 includes a plurality of electrode-connecting terminals 14a and 14b that can connect a battery cell 40 to the circuit board 20.

A battery-cell place is provided on the second surface of the circuit board 20, that is the opposite surface of the surface onto which the IC device 10 is mounted, so as to be overlapped by the IC device 10. In the battery-cell place, the button-like battery cell 40 is placed. The electrode-connecting terminals 14a and 14b electrically connect electrodes of the battery cell 40 to the circuit board 20. More specifically, the electrode-connecting terminal 14a is brought into contact with the positive electrode of the battery cell 40 provided on one surface of the battery cell 40, thereby connecting the positive electrode of the battery cell 40 to the second surface of the circuit board 20. The electrode-connecting terminal 14b is brought into contact with the negative electrode of the battery cell 40 provided on the other surface of the battery cell 40, that is opposite to the surface on which the positive electrode thereof is provided, thereby connecting the negative electrode of the battery cell 40 to the second surface of the circuit board 20.

FIG. 5B is a top view of the IC assembly 100. The IC device 10 is connected to IC-connecting portions 24 on the first surface of the circuit board 20 via the connecting terminals 16. The electrode-connecting terminals 14a and 14b that are in contact with the positive and negative electrodes of the battery cell 40, respectively, are connected to predetermined portions on the second surface of the circuit board 20.

According to the arrangement shown in FIGS. 5A and 5B, it is possible to efficiently use the circuit board 20 as compared to the arrangement in which the battery cell 40 and the IC device 10 are arranged on the circuit board 20 separately from each other, since the battery cell 40 can be arranged on the surface of the circuit board 20 opposite to the surface on which the IC device 10 is placed. Thus, the arrangement of the present embodiment is advantageous to the size reduction of the portable device.

Figure 6:
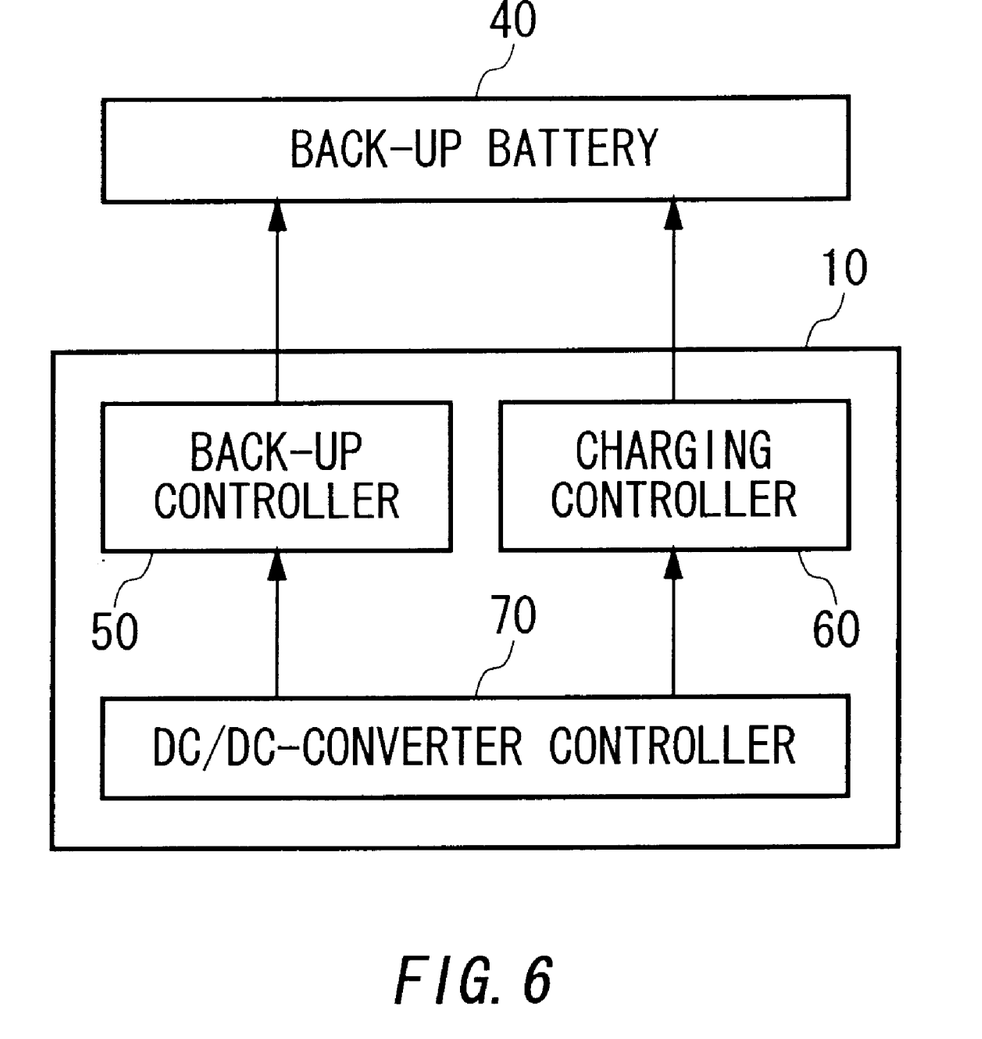
FIG. 6 is a functional block diagram of an IC device of the IC assembly according to any of the first to the fifth embodiments of the present invention.

FIG. 6 is a functional block diagram showing exemplary functions of the IC device 10. In any of the above embodiments, the IC device 10 may be an IC device for controlling a backup battery cell incorporated in a portable device such as a camera, that includes a main battery and an additional battery for backup. That is, the battery cell 40 included in the IC assembly 100 of any of the first through fifth embodiments maybe used as the additional battery for backup in the portable device. In this case, it is preferable that the battery cell 40 as the additional battery be chargeable. The IC device 10 may have functions of a backup controller 50, a charging controller 60 and a DC/DC converter controller 70. The backup controller 50 controls power supply to the portable device from the battery cell 40 to be used for backup of the device. The charging controller 60 controls a charging operation in which the battery cell 40 is charged by using electric power supplied from a power source (not shown). The DC/DC converter controller 70 controls a voltage to be supplied when the backup controller 50 supplies the power to the device. The DC/DC converter controller 70 also controls a charging voltage when the charging controller 60 charges the battery cell 40. As described above, the IC device 10 maybe an IC device for controlling the backup battery cell 40 that has the functions required for using the battery cell 40. In this case, it is possible to simply design circuits on the circuit board 20 by using the arrangement according to any of the first to the fifth embodiments.

Moreover, the portable device, such as the camera, generally includes another IC device in order to control a DC/DC converter circuit (not shown). The other IC device may include a DC/DC converter controller similar to the DC/DC converter controller 70 of the IC device for controlling the backup battery cell shown in FIG. 6. Therefore, the size of the portable device can be further reduced by allowing both the IC devices to use a single DC/DC converter controller 70 commonly. For example, the IC device for controlling the DC/DC converter may be used as the IC device 10 according to the present invention, when the functions of the backup controller 50 and the charging controller 60 are provided in the IC device.

The present invention can be applied to an IC device other than the IC device for controlling the backup battery cell described above. Especially, an IC device having free space which can include a further circuit may be used as the IC device according to the present invention. In such an IC device, a circuit for implementing the backup controller 50 and the charging controller 60 may be provided in the free space. In this case, further size reduction can be obtained.

As is apparent from the above description, according to the present invention, an IC device having a reduced size, circuit board and an IC assembly can be provided.

Although the present invention has been described by way of exemplary embodiments, it should be understood that those skilled in the art might make many changes and substitutions without departing from the spirit and the scope of the present invention which is defined only by the appended claims.

What is claimed is:

1. An IC device for use with a battery cell, comprising:

an IC operable to be mounted on a circuit board;

a plurality of connecting terminals, extending from said IC, operable to fix said IC to said circuit board; and a plurality of electrode-connecting terminals operable to connect said battery cell to said circuit board when said battery cell is mounted on said circuit board in such a manner that one of said battery cell and said IC overlaps the other in a direction substantially perpendicular to said circuit board.

2. An IC device as claimed in claim 1, wherein parts of said plurality of connecting terminals serve as said electrode-connecting terminals.

3. An IC device as claimed in claim 1, wherein said IC device includes a controller operable to control power supply from said battery cell.

4. A circuit board for use with an IC device and a battery cell, comprising:

a first surface onto which said IC device is to be mounted;

a second surface opposite to said first surface; and a plurality of electrode-connecting terminals operable to connect said battery cell to said circuit board when said battery cell is mounted on said circuit board in such a manner that one of said IC device and said battery cell overlaps the other in a direction substantially perpendicular to said circuit board.

5. A circuit board as claimed in claim 4, wherein said battery cell is mounted on said first surface to be placed on said IC device.

6. A circuit board as claimed in claim 4, wherein said battery cell is mounted on said second surface, and said electrode-connecting terminals are provided on said second surface.

7. A circuit board as claimed in claim 6, further comprising a battery accommodating portion, formed in said second surface, operable to accommodate at least a part of said battery cell.

8. A circuit board as claimed in claim 7, wherein said battery accommodating portion is a dent formed in said second surface.

9. An IC assembly comprising:

a circuit board;

an IC device mounted on said circuit board, said IC device including an IC placed on said circuit board and a plurality of connecting terminals operable to fix said IC onto said circuit board; and a battery cell mounted on said circuit board in such a manner that one of said IC device and said battery cell overlaps the other in a direction substantially perpendicular to said circuit board, wherein a plurality of electrode-connecting terminals are provided to connect said battery cell to said circuit board.

10. An IC assembly as claimed in claim 9, wherein said battery cell is placed on said IC of said IC device.

11. An IC assembly as claimed in claim 10, wherein parts of said plurality of connecting terminals of said IC device serve as said electrode-connecting terminals.

12. An IC assembly as claimed in claim 10, wherein said electrode-connecting terminals are provided separately from said connecting terminals.

13. An IC assembly as claimed in claim 9, wherein said circuit board includes a first surface on which said IC device is mounted and a second surface opposite to said first surface, and said battery cell is mounted on said second surface and said electrode-connecting terminals are provided on said second surface.

14. An IC assembly as claimed in claim 13, wherein said battery cell is mounted on said second surface to be overlapped by said IC device.

15. An IC assembly as claimed in claim 14, wherein said second surface of said circuit board has a battery accommodating portion operable to accommodate at least a part of said battery cell therein.

16. An IC assembly as claimed in claim 15, wherein said battery accommodating portion is an opening passing from said second surface to said first surface.

17. An IC assembly as claimed in claim 15, wherein said battery accommodating portion is a dent formed in said second surface.

18. An IC assembly as claimed in claim 9, wherein said battery cell is a battery cell for backup of a device into which said IC assembly is incorporated.

19. An IC assembly as claimed in claim 18, wherein said IC device has at least a function of controlling power supply from said battery cell to said device.

20. An IC assembly as claimed in claim 18, wherein said battery cell is chargeable, and said IC device has at least a function of controlling charging of said battery cell.

* * * * *